US 11,979,116 B2

(12) United States Patent
Goli et al.

(10) Patent No.: US 11,979,116 B2
(45) Date of Patent: May 7, 2024

(54) ENHANCED AMPLIFIER TOPOLOGY IN AN ANALOG FRONT END (AFE)

(71) Applicant: Texas Instruments Incorporated, Dallas, TX (US)

(72) Inventors: Sravana Kumar Goli, Bangalore (IN); Nagesh Surendranath, Plano, TX (US); Srinivas Bangalore Seshadri, Bangalore (IN); Sandeep Kesrimal Oswal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 678 days.

(21) Appl. No.: 17/137,685

(22) Filed: Dec. 30, 2020

(65) Prior Publication Data

US 2022/0209722 A1 Jun. 30, 2022

(51) Int. Cl.
*H03F 3/08* (2006.01)
*G01T 1/175* (2006.01)
*H03L 7/093* (2006.01)
*H03M 1/60* (2006.01)

(52) U.S. Cl.
CPC ............. *H03F 3/082* (2013.01); *G01T 1/175* (2013.01); *H03L 7/093* (2013.01); *H03M 1/60* (2013.01)

(58) Field of Classification Search
CPC ...... H03F 3/082; H03F 3/087; H03F 3/45475; H03F 2203/45514; H03M 1/60; H03M 1/66; H03M 1/124; H04N 25/75; H04N 5/32; G01T 1/175; H03L 7/093
USPC .......................................................... 330/308
See application file for complete search history.

(56) References Cited

U.S. PATENT DOCUMENTS

| 2010/0090772 A1* | 4/2010 | Hu ......................... H03K 3/011 |
| | | 331/143 |
| 2013/0329853 A1* | 12/2013 | Coln ...................... G06G 7/186 |
| | | 378/19 |

\* cited by examiner

*Primary Examiner* — Andrea Lindgren Baltzell
*Assistant Examiner* — Khiem D Nguyen
(74) *Attorney, Agent, or Firm* — Valerie M. Davis; Frank D. Cimino

(57) ABSTRACT

In described examples, a circuit includes an integrator. The integrator generates a first signal responsive to an input signal. A trigger circuit is coupled to the integrator and receives the first signal. A charge dump circuit is coupled to the integrator and the trigger circuit. The trigger circuit modifies configuration of the charge dump circuit and the integrator when the first signal is greater than a first threshold.

21 Claims, 5 Drawing Sheets

ENHANCED AMPLIFIER TOPOLOGY IN AN ANALOG FRONT END (AFE)

TECHNICAL FIELD

The present disclosure is generally related to analog front end (AFE), and more particularly to an improved amplifier in an AFE used in imaging applications.

BACKGROUND

Computed tomography (CT) is a medical imaging technique that produces three-dimensional images of internal human body parts from a large series of two-dimensional X-ray images (called profiles) taken in a single-axis rotating structure called a gantry. When compared to a conventional X-ray radiograph, which is an image of many planes superimposed on each other, a CT image exhibits significantly improved contrast.

With the advent of diagnostic imaging systems like CT, where complex and intensive image processing is required, semiconductors play a very important role in developing systems with increased density, flexibility and high performance. The helical or spiral CT machines that use faster computer systems and optimized software can continuously process the cross-section images while the object passes through the gantry at a constant speed. The gantry includes an X-ray source that rotates around the object, with multiple detectors positioned on the opposite side of the circle from the X-ray source. Many data scans are taken progressively as the patient/object is gradually passed through the gantry. An imaging system like CT includes multiple detectors, and each detector includes a photodiode and an AFE (analog front end).

A photodiode receives the X-rays attenuated by the patient and generates a corresponding current signal which is further converted to a digital signal by the AFE. The current signal generated is proportional to the energy of the photons received by the photodiode. The AFE includes an amplifier and an analog to digital converter (ADC). Under the constraints of area and power, the amplifier in the AFE is required to support high dynamic range which is difficult to achieve with existing architectures.

SUMMARY

In described examples, a circuit includes an integrator. The integrator generates a first signal responsive to an input signal. A trigger circuit is coupled to the integrator and receives the first signal. A charge dump circuit is coupled to the integrator and the trigger circuit. The trigger circuit modifies configuration of the charge dump circuit and the integrator when the first signal is greater than a first threshold.

DETAILED DESCRIPTION OF EXAMPLE EMBODIMENTS

Figure 1:
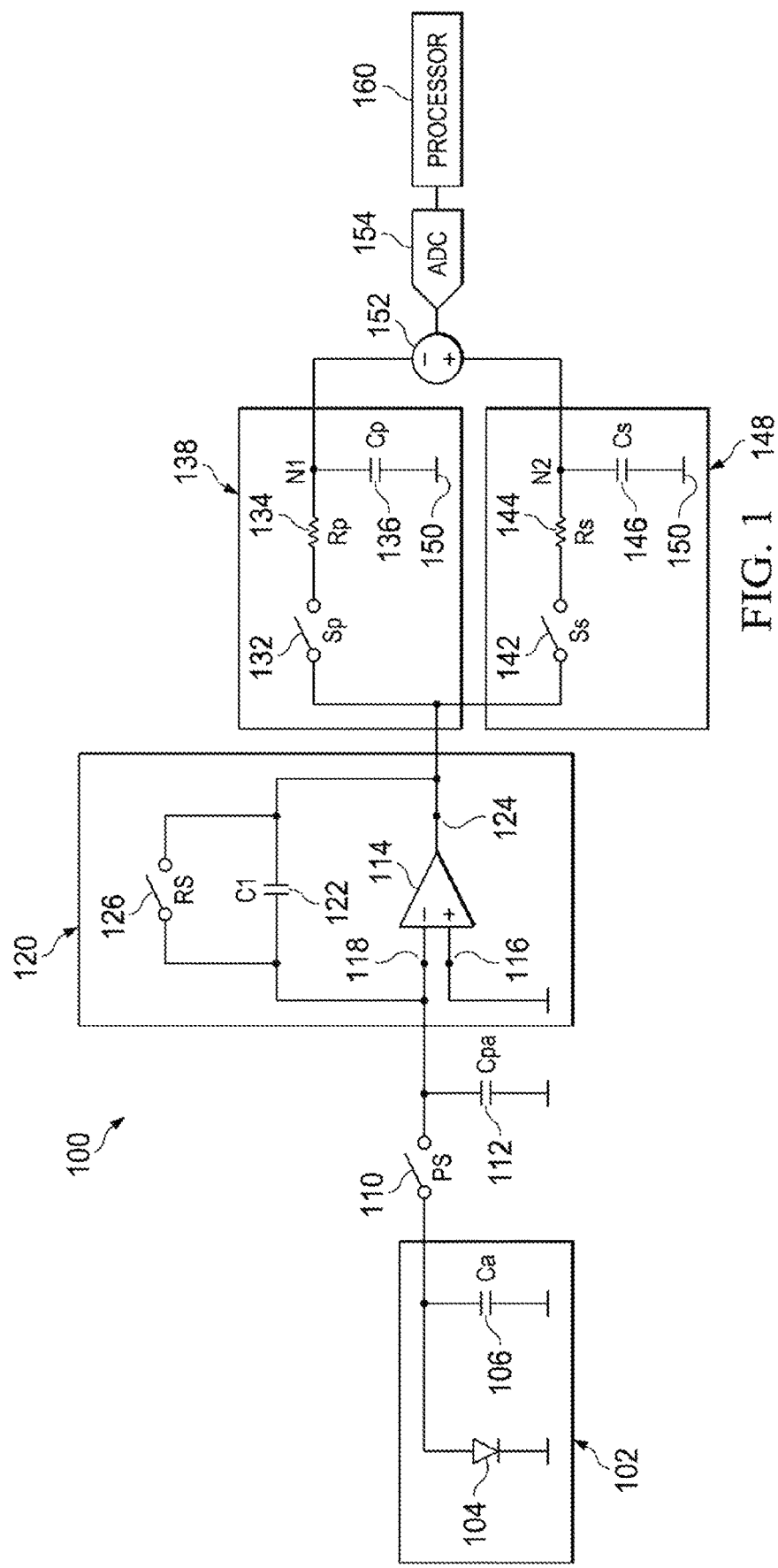
FIG. 1 is a block diagram illustrating a circuit.

FIG. 1 is a block diagram illustrating a circuit 100. The circuit 100 includes a photodiode 102, an integrator 120, a first sampling network 138, a second sampling network 148, an analog to digital converter (ADC) 154 and a processor 160. The photodiode 102 includes a sensor 104 and an associated capacitor Ca 106. The integrator 120 is coupled to the photodiode 102 through a pixel switch PS 110. The integrator 120 includes an amplifier 114, a first capacitor C1 122 and a reset switch RS 126. A parasitic capacitance Cpa 112 is associated with the pixel switch PS 110. It is understood that the parasitic capacitor is represented for purpose of illustration and it represents input parasitic capacitance of the amplifier 114. The parasitic capacitance also develops because of routing on the board or PCB (printed circuit board) where the circuit 100 is placed. This parasitic capacitor is generally in the order of Pico farads.

The amplifier 114 includes an inverting terminal 118, a non-inverting terminal 116 and an output terminal 124. The first capacitor C1 122 is coupled between the inverting terminal 118 and the output terminal 124. The reset switch RS 126 is coupled in parallel to the first capacitor C1 122. The first sampling network 138 and the second sampling network 148 are coupled to the integrator 120. The first sampling network 138 includes a primary switch Sp 132, a primary resistor Rp 134, a primary capacitor Cp 136. The second sampling network 148 includes a secondary switch Ss 142, a secondary resistor Rs 144, a secondary capacitor Cs 146. A subtractor 152 is coupled to the first sampling network 138 and the second sampling network 148.

The primary switch Sp 132 and the secondary switch Ss 142 are coupled to the integrator 120. The primary resistor Rp 134 is coupled between the primary switch Sp 132 and a first node N1. The primary capacitor Cp 136 is coupled between the first node N1 and a ground terminal 150. The secondary resistor Rs 144 is coupled between the secondary switch Ss 142 and a second node N2. The secondary capacitor Cs 146 is coupled between the second node N2 and the ground terminal 150. The subtractor 152 is coupled to the first node N1 and the second node N2. The ADC 154 is coupled to the subtractor 152, and the processor 160 is coupled to the ADC 154.

The operation of the circuit 100 illustrated in FIG. 1 is explained now. The circuit 100 operates in a reset phase, an offset phase and a signal phase. In the reset phase, the reset switch RS 126 is closed, and the pixel switch PS 110, the primary switch Sp 132 and the secondary switch Ss 142 are opened. The reset phase is used to reset the first capacitor C1 122 and to discharge any accumulated charge in the first capacitor C1 122.

In the offset phase, the reset switch RS 126 is opened. An offset voltage is sampled on the first capacitor C1 122. The pixel switch PS 110 and the secondary switch Ss 142 remain open. The primary switch Sp 132 is closed. The offset voltage is sampled on the first sampling network 138. Henceforth, a voltage generated at the first node N1 is the offset voltage.

In the signal phase, the reset switch RS 126 remains open. The primary switch Sp 132 is opened, and the pixel switch PS 110 and the secondary switch Ss 142 are closed. The photodiode 102 generates an input signal in response to received light pulses. The sensor 104 in the photodiode 102 receives the light pulses, and the associated capacitor Ca 106 stores the input signal generated in response to the received light pulses.

The input signal from the photodiode 102 is provided to the integrator 120 which generates a signal voltage. The signal voltage is sampled on the second sampling network 148. Thus, a voltage at the second node N2 is the signal voltage. The subtractor 152 receives the offset voltage at the first node N1 and the signal voltage at the second node N2. The subtractor 152 subtracts the offset voltage from the signal voltage to generate a sampled voltage. The ADC 154 generates a digital signal in response to the sampled voltage, and the processor 160 stores and processes the digital signal received from the ADC 154. The reset phase, the offset phase and the signal phase constitute a cycle, and a cycle spans for a frame time T. After the signal phase, the pixel switch PS 110 is opened to reset the first capacitor C1 122.

A range of the input signal which can be accommodated by the integrator 120 depends on a dynamic range of the amplifier 114. The dynamic range of the amplifier 114 is limited by values of first capacitor C1 122, a time period of the signal phase (time period in which photodiode 102 is coupled to the integrator 120), and a supply voltage of the amplifier 114. Hence, the dynamic range of the amplifier 114 needs to be increased to support higher range of the input signal. Increasing the supply voltage of the amplifier 114 would result in increased power requirement of the circuit 100. Another alternative is to increase the value of the first capacitor C1 122 which again comes at the cost of increased area.

Figure 2:
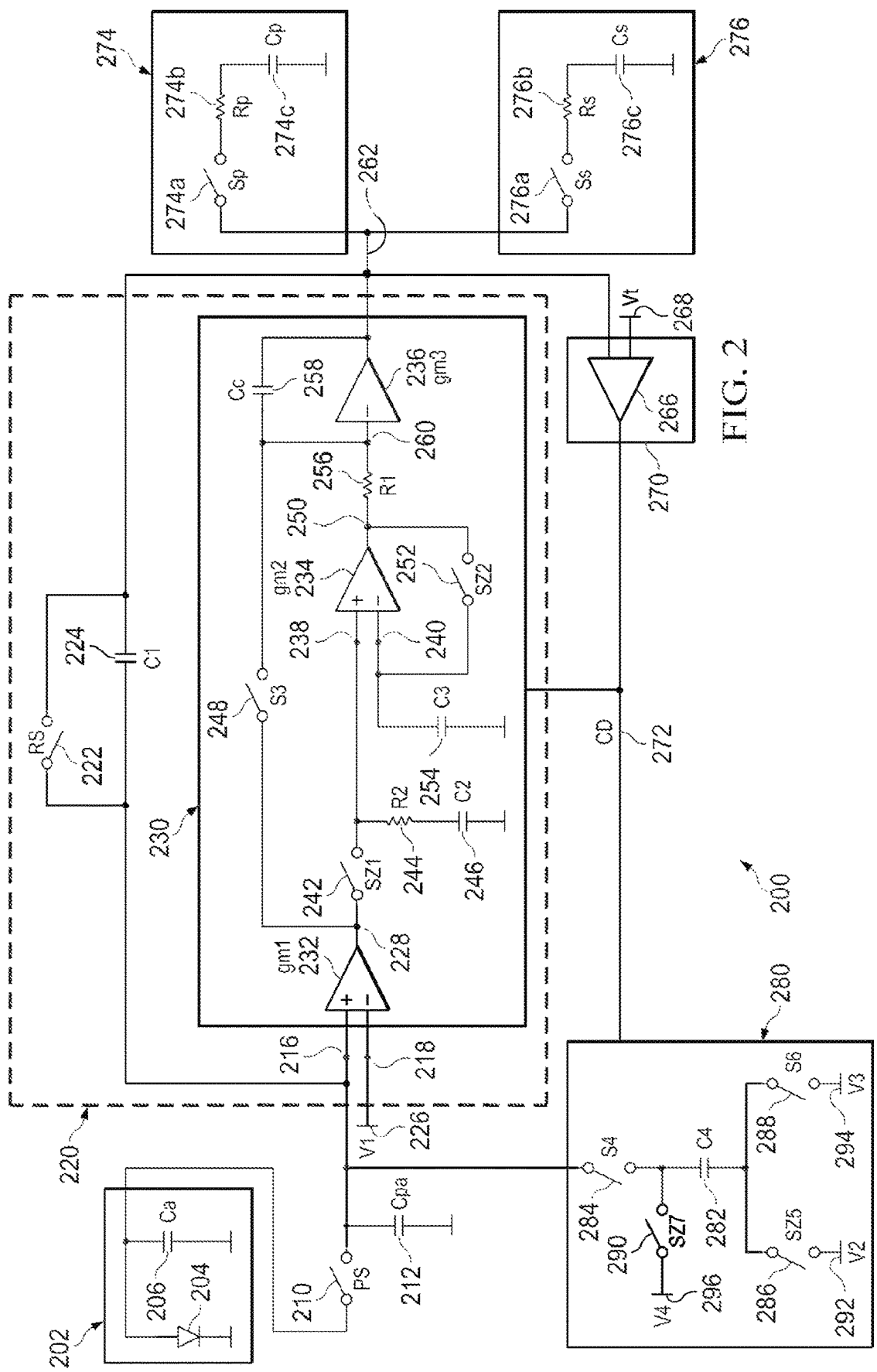
FIG. 2 is a block diagram illustrating a circuit, according to an embodiment.

FIG. 2 is a block diagram illustrating a circuit 200, according to an embodiment. The circuit 200 includes a photodiode 202, an integrator 220, a first sampling network 274, a second sampling network 276, a trigger circuit 270 and a charge dump circuit 280. The photodiode 202 includes a sensor 204 and an associated capacitor Ca 206. The integrator 220 is coupled to the photodiode 202 through a pixel switch PS 210. A parasitic capacitance Cpa 212 is associated with the pixel switch PS 210. The integrator 220 includes an amplifier 230. It is understood that the parasitic capacitor is represented for purpose of illustration and it represents input parasitic capacitance of the amplifier 230. The parasitic capacitance also develops because of routing on the board or PCB where the circuit 200 is placed. This parasitic capacitor is generally in the order of Pico farads.

The integrator 220 includes a first capacitor C1 224 and a reset switch RS 222. The amplifier 230 in the integrator 220 is coupled to the charge dump circuit 280. The first capacitor C1 224 is coupled between an input terminal of the amplifier 230 and an output terminal of the amplifier 230. The reset switch RS 222 is coupled in parallel to the first capacitor C1 224.

The amplifier 230 includes a first transconductor gm1 232, a second transconductor gm2 234 and a third transconductor gm3 236. The amplifier 230 also includes a first switch SZ1 242, a second switch SZ2 252 and a third switch S3 248. The amplifier 230 includes a second capacitor C2 246, a third capacitor C3 254, a coupling capacitor Cc 258, a first resistor R1 256 and a second resistor R2 244. A positive terminal 216 of the first transconductor gm1 232 is coupled to the pixel switch PS 210, and a negative terminal 218 of the first transconductor gm1 232 is coupled to a first voltage source V1 226. In one example, the negative terminal 218 of the first transconductor gm1 232 is coupled to a ground terminal. The first switch SZ1 242 is coupled to an output terminal 228 of the first transconductor gm1 232.

A positive terminal 238 of the second transconductor gm2 234 is coupled to the first switch SZ1 242. An RC network is coupled to the first switch SZ1 242 and to the second transconductor gm2 234. The RC network includes the second resistor R2 244 and the second capacitor C2 246. The second resistor R2 244 is coupled to the first switch SZ1 242. The second capacitor C2 246 is coupled to the second resistor R2 244 and to a ground terminal. The second switch SZ2 252 is coupled between a negative terminal 240 and an output terminal 250 of the second transconductor gm2. The third capacitor C3 254 is coupled between the negative terminal 240 of the second transconductor gm2 234 and the ground terminal.

The first resistor R1 256 is coupled between the second transconductor gm2 234 and the third transconductor gm3 236. A negative terminal 260 of the third transconductor gm3 236 is coupled to the first resistor R1 256. The coupling capacitor Cc 258 is coupled between the negative terminal 260 and the output terminal 262 of the third transconductor gm3 236. The third switch S3 248 is coupled between the output terminal 228 of the first transconductor gm1 232 and the negative terminal 260 of the third transconductor gm3 236. The positive terminal of the first transconductor gm1 232 is the input terminal of amplifier 230 and the output terminal 262 of the third transconductor gm3 is the output terminal of the amplifier 230.

The trigger circuit 270 is coupled to the integrator 220. The trigger circuit 270 includes a comparator 266. The comparator 266 is coupled to the output terminal 262 of the third transconductor gm3 236. The comparator 266 also receives a first threshold Vt 268. The charge dump circuit 280 is coupled to the trigger circuit 270 and to the integrator 220. The charge dump circuit 280 includes a fourth switch S4 284, a fifth switch SZ5 286, a sixth switch S6 288 and a seventh switch SZ7 290 and a fourth capacitor C4 282.

The fourth switch S4 284 is coupled between the integrator 220 and the fourth capacitor C4 282. The fourth capacitor C4 282 is coupled to one of a second voltage source V2 292 and a third voltage source V3 294. The fourth capacitor C4 282 is coupled to the second voltage source V2 292 through the fifth switch SZ5 286. The fourth capacitor C4 282 is coupled to the third voltage source V3 294 through the sixth switch S6 288. The seventh switch SZ7 290 is coupled between a fourth voltage source V4 296 and the fourth switch S4 284. The fourth capacitor C4 282 is coupled to the seventh switch SZ7 290.

The first sampling network 274 and the second sampling network 276 are coupled to the integrator 220. The first sampling network 274 includes a primary switch Sp 274a, a primary resistor Rp 274b and a primary capacitor Cp 274c. The second sampling network 276 includes a secondary switch Ss 276a, a secondary resistor Rs 276b and a secondary capacitor Cs 276c. The primary switch Sp 274a is coupled between the output terminal 262 of the third transconductor gm3 and the primary resistor Rp 274b. The primary capacitor Cp 274c is coupled between the primary resistor Rp 274b and the ground terminal.

The secondary switch Ss 276a is coupled between the output terminal 262 of the third transconductor gm3 and the secondary resistor Rs 276b. The secondary capacitor Cs 276c is coupled between the secondary resistor Rs 276b and the ground terminal. Similar to circuit 100 illustrated in FIG. 1, the first sampling network 274 and the second sampling network are coupled to a subtractor. Also, the circuit 200 includes an ADC (analog to digital converter) and a processor which are not illustrated in FIG. 2 nor described herein for brevity. Also, each block or component of FIG. 2 may be coupled to some conventional components, which are not shown in FIG. 2 for simplicity.

In operation, the circuit 200 operates in a reset phase, an offset phase, an integration phase and an auto-ranging disable phase. In the reset phase, the pixel switch PS 210 is opened. The reset switch RS 222, the first switch SZ1 242 and the second switch SZ2 252 are closed. The third switch S3 248, the fourth switch S4 284 and the sixth switch S6 288 are opened. The fifth switch SZ5 286 and the seventh switch SZ7 290 are closed. The primary switch Sp 274a and the secondary switch Ss 276a are opened. The reset phase is used to reset the first capacitor C1 224 and to discharge any accumulated charge in the first capacitor C1 224.

In the offset phase, the reset switch RS 222 is opened. A residual noise is sampled on the first capacitor C1 224 which generates an offset voltage at the output terminal 262 of the amplifier 230. The first switch SZ1 242 and the second switch SZ2 252 remain closed. The pixel switch PS 210, the third switch S3 248, the fourth switch S4 284 and the sixth switch S6 288 remain open. The fifth switch SZ5 286 and the seventh switch SZ7 290 remain closed. The primary switch Sp 274a is closed, and the offset voltage is sampled on the first sampling network 274.

In the integration phase, the reset switch RS 222 remains open. The primary switch Sp 274a is opened and the pixel switch PS 210 is closed. The first switch SZ1 242 and the second switch SZ2 252 remain closed. The third switch S3 248, the fourth switch S4 284 and the sixth switch S6 288 remain open. The fifth switch SZ5 286 and the seventh switch SZ7 290 remain closed. The secondary switch Ss 276a is closed.

The photodiode 202 generates an input signal in response to received light pulses. The sensor 204 in the photodiode 202 receives the light pulses, and the associated capacitor Ca 206 stores the input signal generated in response to the received light pulses. The input signal from the photodiode 202 is provided to the integrator 220 which generates a first signal. The trigger circuit 270 receives the first signal from the integrator 220.

In the integration phase, when the first signal generated by the integrator 220 is greater than a first threshold Vt 268, the trigger circuit 270 modifies a configuration of the charge dump circuit 280 and the integrator 220. The trigger circuit 270 generates a second signal CD 272 when the first signal is greater than the first threshold Vt 268. In one example, the comparator 266 compares the first signal and the first threshold Vt 268 to generate the second signal CD 272 when the first signal is greater than the first threshold Vt 268. In another example, the trigger circuit 270 includes one or more components that process the first signal to generate the second signal CD 272 when the first signal is greater than the first threshold Vt 268. The second signal CD 272 modifies the configuration of the charge dump circuit 280 and the integrator 220. In the amplifier 230, the second signal CD 272 opens the first switch SZ1 242 and the second switch SZ2 252. The second signal CD 272 also closes the third switch S3 248 of the amplifier 230. In the charge dump circuit 280, the second signal CD 272 opens the fifth switch SZ5 286 and the seventh switch SZ7 290. The second signal CD 272 also closes the fourth switch S4 284 and the sixth switch S6 288 to activate the charge dump circuit 280.

The activation of charge dump circuit 280 results in discharging of the first capacitor C1 224 through the charge dump circuit 280. The first capacitor C1 224 can accommodate a maximum charge which is dependent on a value of the first capacitor C1 224. Thus, the circuit 200 needs the value of the first capacitor C1 224 to be large to accommodate a high range of the input signal. However, higher value of the first capacitor C1 224 means a larger area which is undesirable. Hence, the circuit 200 uses an auto-ranging feature through the use of the trigger circuit 270 and the charge dump circuit 280.

The first threshold Vt 268 is equivalent to a maximum charge that the first capacitor C1 224 can hold. Hence, when the first signal generated by the integrator 220 is equal to or greater than the first threshold Vt 268, the charge dump circuit 280 is activated which results in discharging of the first capacitor C1 224. This results in a drop in the first voltage. In one example, the first voltage drops to zero volt. This process is called as auto-ranging. The auto-ranging feature is now explained with the help of an example. When the input signal is 1 µA and the integration phase is for 100 µs, a 100 pico-coulomb charge needs to be accommodated by the first capacitor C1 224. When a value of the first capacitor C1 224 is 10 pF and a maximum voltage swing at integrator 220 is 1.25V, the first capacitor C1 224 can only accommodate 12.5 pico-coulomb charge.

When the first threshold Vt 268 is fixed at 1.25V, and the first signal reaches a level of 1.25V, the trigger circuit 270 generates the second signal CD 272. On receiving the second signal CD 272, the charge dump circuit 280 is activated. Considering that the second voltage source V2 292 and the fourth voltage source V4 296 is at zero volt, and the third voltage source V3 294 is at 1.25V. In one example, a value of the fourth capacitor C4 282 is equal to a value of the first capacitor C1 224. The fourth capacitor C4 282, at the beginning of the integration phase, is at zero volt, which is a difference of the fourth voltage source V4 296 and the second voltage source V2 292. Once the charge dump circuit 280 is activated by the second signal CD 272, one plate of the fourth capacitor C4 282 is at 1.25V (equal to the third voltage source V3 294), and the other plate starts charging to a potential at the positive terminal 216 of the first transconductor gm1 232. In one example, the positive terminal 216 is at zero volt. This discharges the first capacitor C1 224. Thus, with the discharge of the first capacitor C1 224, the output of the integrator 220 drops to zero volt. During the integration phase, the first capacitor C1 224 discharges (or dumps) the charge through the charge dump circuit 280 multiple times. The circuit 200 accommodates a greater number of charge dumps in a given integration time. The information of the number of charge dumps is provided to the ADC and used to determine value of the input signal. During the integration phase, when the first signal is less than the first threshold Vt 268, the amplifier 230 and the charge dump circuit 280 reverts to the original configuration. The auto-ranging feature increases the dynamic range of the amplifier 230.

The auto-ranging disable phase is initiated during the integration phase, and the auto-ranging disable phase ends with the integration phase. In auto-ranging disable phase, the trigger circuit 270 and the charge dump circuit 280 are disabled. The pixel switch PS 210 remains closed. The third S3 248 switch is opened. The first switch SZ1 242 and the second switch SZ2 252 are closed. In the charge dump circuit 280, the fourth switch S4 284 and the sixth switch S6 288 are opened while the fifth switch SZ5 286 and the seventh switch SZ7 290 are closed. The secondary switch Ss 276a remains closed and a signal voltage is sampled on the second sampling network 276.

The timing for initiating the auto-ranging disable phase depends on at least two factors: a maximum conversion jitter and a minimum filtering time needed to filter a thermal noise introduced by the integrator 220 at the output terminal 262 of the amplifier 230. The conversion jitter is variation in timing when the photodiode 202 is decoupled from the integrator 220. In the example discussed above where the value of the first capacitor C1 224 is 10 pF and the integration phase is for 100 μs, the auto-ranging disable phase is needed for 10 μs. This would require increasing range of the amplifier 230 (or increasing the swing at the output of the integrator 220). By using conventional methods, increasing range would require increasing the value of the first capacitor C1 224 which is undesirable as it increases the overall area of the circuit 200.

Therefore, in the circuit 200, the range of amplifier 230 is increased by reducing the value of the fourth capacitor C4 282. This reduces the swing at the output of the integrator 220. In the example discussed above, the swing at the output of integrator 220 is reduced to 0.25V from 1.25V. This enables additional swing of 1V in the auto-ranging disable phase. However, this limits the time available for the discharge of the first capacitor C1 224 through the charge dump circuit 280. In the example discussed above, this time is reduced to 1.25 μs for the input signal of 1 μA. To overcome this problem, the circuit 200 provides multiple configurations of the amplifier 230.

In the integration phase, when the charge dump circuit 280 is activated by the second signal CD 272, the amplifier 230 is configured as a miller compensation amplifier. The second signal CD 272 is generated when the first signal is greater than the first threshold. The second signal CD 272 generated by the trigger circuit 270 configures the amplifier 230 as miller compensation amplifier. The second signal CD 272 opens the first switch SZ1 242 and the second switch SZ2 252. The second signal CD 272 also closes the third switch S3 248 of the amplifier 230. Thus, the second transconductor gm2 234 is degenerated and it acts as a constant current source (or current buffer) providing current to the coupling capacitor Cc 258. In one version, the second transconductor gm2 234 acts as a voltage controlled current source. In another version, each of the transconductor in circuit 200 acts as a voltage controlled current source. The combination of the first transconductor gm1 232, the second transconductor gm2 234 (being configured as the constant current source) and the third transconductor gm3 236 acts as the miller compensation amplifier with a very low input impedance for the input signal. A zero of the RC network (the second resistor R2 244 and the second capacitor C2 246) is bypassed when the amplifier 230 is configured as miller compensation amplifier.

In the integration phase, when the first signal is less than the first threshold, the second signal CD 272 is not generated. During this time, the amplifier 230 is configured to RC compensation amplifier. The third S3 248 switch is opened. The first switch SZ1 242 and the second switch SZ2 252 are closed. Since the second transconductor gm2 234 is put in a loop with feedback, it acts as the voltage buffer. Thus, the second transconductor gm2 234 is configured as a voltage buffer. Also, the charge dump circuit 280 in inactivated as the fourth switch S4 284 and the sixth switch S6 288 are opened while the fifth switch SZ5 286 and the seventh switch SZ7 290 are closed. The RC compensation amplifier configuration ensures low input impedance for the input signal. Other advantages of this configuration include, but not limited to, low offset drift and low error during discharge of the first capacitor C1 224 through the charge dump circuit 280.

The dynamic configuration of the amplifier 230 provides multiple operational advantages to the circuit 200. For example, if the amplifier 230 is only capable of being configured as RC compensation amplifier then during the phase when the first signal is greater than the first threshold Vt 268, the charge dump circuit 280 is activated by the second signal CD 272. The charge dump circuit 280 pumps a current in the integrator 220. This current is constant for a defined time and decays exponentially at the end of charge dump. The integration of this current is equivalent to a charge dumped by the first capacitor C1 224. To supply this current to the first capacitor C1 224, the second capacitor C2 246 shifts from a steady state voltage to a temporary voltage level for the defined time. This in-turn results in a voltage shift at the positive terminal 216 of the first transconductor gm1 232. In one example, the voltage shift is from a zero voltage to a non-zero voltage.

A time taken for the positive terminal 216 to return to its original voltage is limited by a time constant of the RC network. However, a minimum time constant of the RC network is defined by phase margin of the amplifier 230. To reduce a residual charge in the second capacitor C2 246, the time constant of the RC network needs to be reduced which in turn degrades the phase margin of the amplifier 230. Hence, operating the amplifier 230 in the miller compensation configuration when the first signal is greater than the first threshold Vt 268 ensures that the zero of the RC network is bypassed and the positive terminal 216 is near to the original voltage, which in one example is zero volt.

The reconfigurable topology of the amplifier 230 between miller and RC compensation allows a greater number of charge dumps in a given integration time. The second transconductor gm2 234 is configured as a voltage buffer when there is no charge dump, and the amplifier 230 is configured as RC compensation amplifier to provide low input impedance to the input signal. The second transconductor gm2 234 is configured as a current buffer during the charge dump, and the amplifier 230 is configured as miller compensation amplifier to provide low input impedance to the input signal.

The circuit 200 also provides for increasing the range of the amplifier 230 without increasing the area or the power of the circuit 200. Thus, the circuit 200 provides for autoranging which increases the dynamic range of the amplifier 230. In addition to auto-ranging, the circuit 200 provides a solution for increasing the range of the amplifier 230 to accommodate the auto-ranging disable phase. The reconfigurable topology of the amplifier 230 along with higher range of the amplifier 230 with greater number of charge dumps makes the circuit 200 ideal for medical imaging applications.

Figure 3:
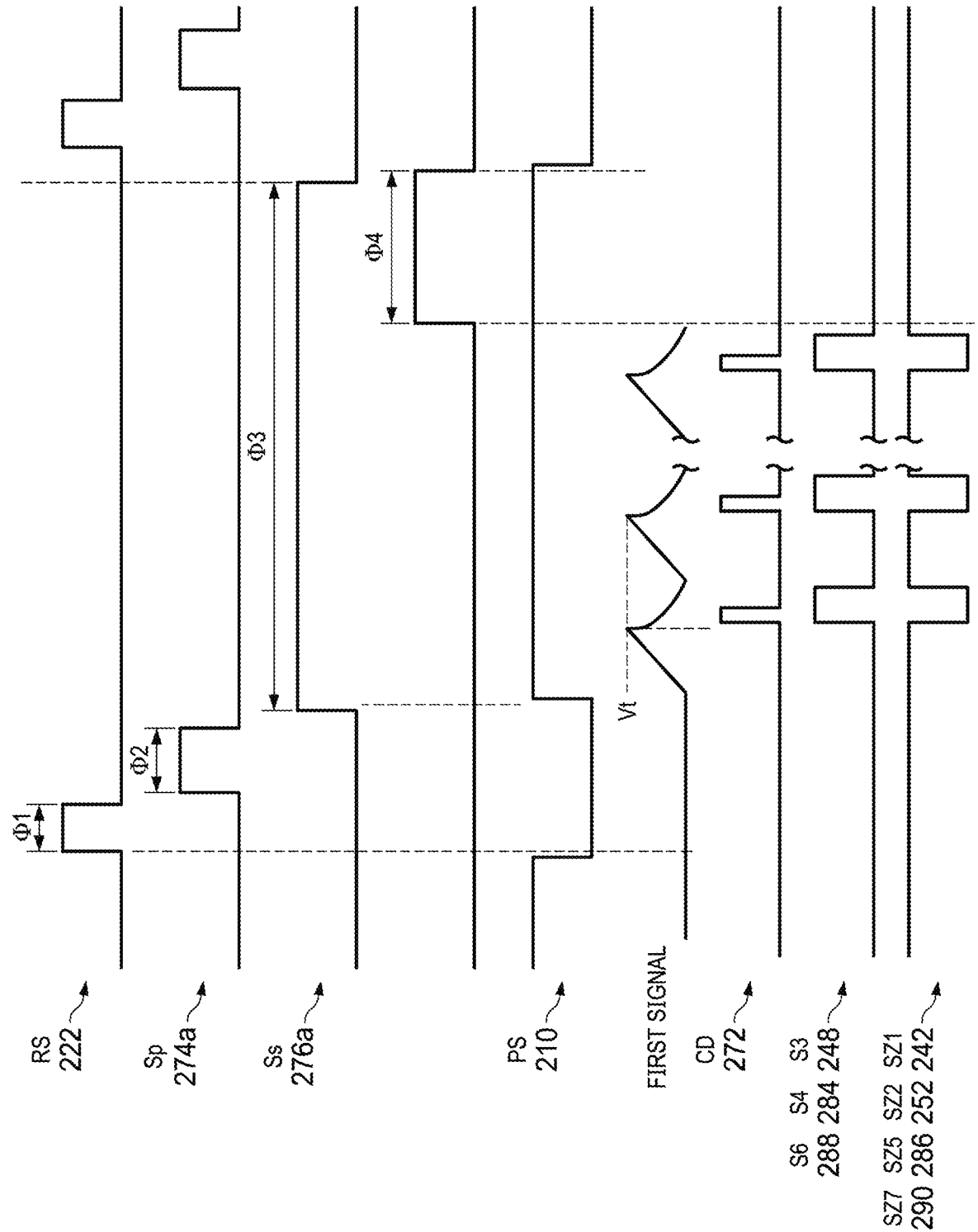
FIG. 3 is a timing diagram illustrating operation of the circuit 200, according to an embodiment.

FIG. 3 is a timing diagram illustrating operation of the circuit 200 in FIG. 2, according to an embodiment. The timing diagram illustrates the various phases of operation of the circuit 200. The timing diagram is explained in connection with the operation of circuit 200 in FIG. 2. Φ1 represents the reset phase. In the reset phase, the pixel switch PS 210 is opened. The reset switch RS 222, the first switch SZ1 242 and the second switch SZ2 252 are closed. The third switch S3 248, the fourth switch S4 284 and the sixth switch S6 288 are opened. The fifth switch SZ5 286 and the seventh switch SZ7 290 are closed. The primary switch Sp 274a and the secondary switch Ss 276a are opened. The reset phase is used to reset the first capacitor C1 224 and to discharge any accumulated charge in the first capacitor C1 224.

Φ2 represents the offset phase. In the offset phase, the reset switch RS 222 is opened. A residual noise is sampled on the first capacitor C1 224 which generates an offset voltage at the output terminal 262 of the amplifier 230. The first switch SZ1 242 and the second switch SZ2 252 remain closed. The pixel switch PS 210, the third switch S3 248, the fourth switch S4 284 and the sixth switch S6 288 remain open. The fifth switch SZ5 286 and the seventh switch SZ7 290 remain closed. The primary switch Sp 274*a* is closed, and the offset voltage is sampled on the first sampling network 274.

Φ3 represents the integration phase. The primary switch Sp 274*a* is opened and the pixel switch PS 210 is closed. The first switch SZ1 242 and the second switch SZ2 252 remain closed. The third switch S3 248, the fourth switch S4 284 and the sixth switch S6 288 remain open. The fifth switch SZ5 286 and the seventh switch SZ7 290 remain closed. The secondary switch Ss 276*a* is closed.

The photodiode 202 generates an input signal in response to received light pulses. The sensor 204 in the photodiode 202 receives the light pulses, and the associated capacitor Ca 206 stores the input signal generated in response to the received light pulses. The input signal from the photodiode 202 is provided to the integrator 220 which generates a first signal. The trigger circuit 270 receives the first signal from the integrator 220.

In the integration phase, when the first signal generated by the integrator 220 is greater than a first threshold Vt 268, the trigger circuit 270 modifies a configuration of the charge dump circuit 280 and the integrator 220. The trigger circuit 270 generates a second signal CD 272 when the first signal is greater than the first threshold Vt 268. The second signal CD 272 modifies the configuration of the charge dump circuit 280 and the integrator 220. In the amplifier 230, the second signal CD 272 opens the first switch SZ1 242 and the second switch SZ2 252. The second signal CD 272 also closes the third switch S3 248 of the amplifier 230. In the charge dump circuit 280, the second signal CD 272 opens the fifth switch SZ5 286 and the seventh switch SZ7 290. The second signal CD 272 also closes the fourth switch S4 284 and the sixth switch S6 288 to activate the charge dump circuit 280.

The activation of charge dump circuit 280 results in discharging of the first capacitor C1 224 through the charge dump circuit 280. The first capacitor C1 224 can accommodate a maximum charge which is dependent on a value of the first capacitor C1 224. Thus, the circuit 200 needs the value of the first capacitor C1 224 to be large to accommodate a high range of the input signal. However, higher value of the first capacitor C1 224 means a larger area which is undesirable. Hence, the circuit 200 uses an auto-ranging feature through the use of the trigger circuit 270 and the charge dump circuit 280.

The first threshold Vt 268 is equivalent to a maximum charge that the first capacitor C1 224 can hold. Hence, when the first signal generated by the integrator 220 is equal to or greater than the first threshold Vt 268, the charge dump circuit 280 is activated which results in discharging of the first capacitor C1 224. This results in a drop in the first signal as illustrated in the timing diagram. In one example, the first voltage drops to zero volt. This process is called as auto-ranging.

Thus, with the discharge of the first capacitor C1 224, the output of the integrator 220 (which is the first signal) drops to zero volt. During the integration phase, the first capacitor C1 224 dumps the charge through the charge dump circuit 280 multiple times. The circuit 200 accommodates a greater number of charge dumps in a given integration time. The information of the number of charge dumps is provided to the ADC and used to determine value of the input signal. During the integration phase, when the first signal is less than the first threshold Vt 268, the amplifier 230 and the charge dump circuit 280 reverts to the original configuration after a defined time period. The auto-ranging feature increases the dynamic range of the amplifier 230.

Φ4 represents the auto-ranging disable phase. The auto-ranging disable phase is initiated during the integration phase, and the auto-ranging disable phase ends with the integration phase. In auto-ranging disable phase, the trigger circuit 270 and the charge dump circuit 280 are disabled. The pixel switch PS 210 remains closed. The third S3 248 switch is opened. The first switch SZ1 242 and the second switch SZ2 252 are closed. In the charge dump circuit 280, the fourth switch S4 284 and the sixth switch S6 288 are opened while the fifth switch SZ5 286 and the seventh switch SZ7 290 are closed. The secondary switch Ss 276*a* remains closed and a signal voltage is sampled on the second sampling network 276.

The timing for initiating the auto-ranging disable phase depends on at least two factors: a maximum conversion jitter and a minimum filtering time needed to filter a thermal noise introduced by the integrator 220 at the output terminal 262 of the amplifier 230. The conversion jitter is variation in timing when the photodiode 202 is decoupled from the integrator 220. A desired timing for auto-ranging disable phase would require increasing range of the amplifier 230. By using conventional methods, increasing range would require increasing the value of the first capacitor C1 224 which is undesirable as it increases the overall area of the circuit 200.

Therefore, in the circuit 200, the range of amplifier 230 is increased by reducing the value of the fourth capacitor C4 282. This reduces the swing at the output of the integrator 220. However, this limits the time available for the discharge of the first capacitor C1 224 through the charge dump circuit 280. To overcome this problem, the circuit 200 provides multiple configurations of the amplifier 230.

In the integration phase, when the charge dump circuit 280 is activated by the second signal CD 272, the amplifier 230 is configured as a miller compensation amplifier. The second signal CD 272 is generated when the first signal is greater than the first threshold. The second signal CD 272 generated by the trigger circuit 270 configures the amplifier 230 as miller compensation amplifier. The second signal CD 272 opens the first switch SZ1 242 and the second switch SZ2 252. The second signal CD 272 also closes the third switch S3 248 of the amplifier 230. Thus, the second transconductor gm2 234 is degenerated and it acts as a constant current source (or current buffer) providing current to the coupling capacitor Cc 258. The combination of the first transconductor gm1 232, the second transconductor gm2 234 (being configured as the constant current source) and the third transconductor gm3 236 acts as the miller compensation amplifier with a very low input impedance for the input signal. A zero of the RC network (the second resistor R2 244 and the second capacitor C2 246) is bypassed when the amplifier 230 is configured as miller compensation amplifier.

In the integration phase, when the first signal is less than the first threshold, the second signal CD 272 is not generated. During this time, the amplifier 230 is configured to RC compensation amplifier. The third S3 248 switch is opened. The first switch SZ1 242 and the second switch SZ2 252 are closed. Thus, the second transconductor gm2 234 is configured as a voltage buffer. Also, the charge dump circuit 280 in inactivated as the fourth switch S4 284 and the sixth switch S6 288 are opened while the fifth switch SZ5 286 and the seventh switch SZ7 290 are closed. The RC compensation amplifier configuration ensures low input impedance for the input signal. Other advantages of this configuration include, but not limited to, low offset drift and low error during discharge of the first capacitor C1 224 through the charge dump circuit 280.

The reconfigurable topology of the amplifier 230 between miller and RC compensation allows a greater number of charge dumps in a given integration time. The second transconductor gm2 234 is configured as a voltage buffer when there is no charge dump, and the amplifier 230 is configured as RC compensation amplifier to provide low input impedance to the input signal. The second transconductor gm2 234 is configured as a current buffer during the charge dump, and the amplifier 230 is configured as miller compensation amplifier to provide low input impedance to the input signal.

The circuit 200 also provides for increasing the range of the amplifier 230 without increasing the area or the power of the circuit 200. Thus, the circuit 200 provides for auto-ranging which increases the dynamic range of the amplifier 230. In addition to auto-ranging, the circuit 200 provides a solution for increasing the range of the amplifier 230 to accommodate the auto-ranging disable phase. The reconfigurable topology of the amplifier 230 along with higher range of the amplifier 230 with greater number of charge dumps makes the circuit 200 ideal for medical imaging applications.

Figure 4:
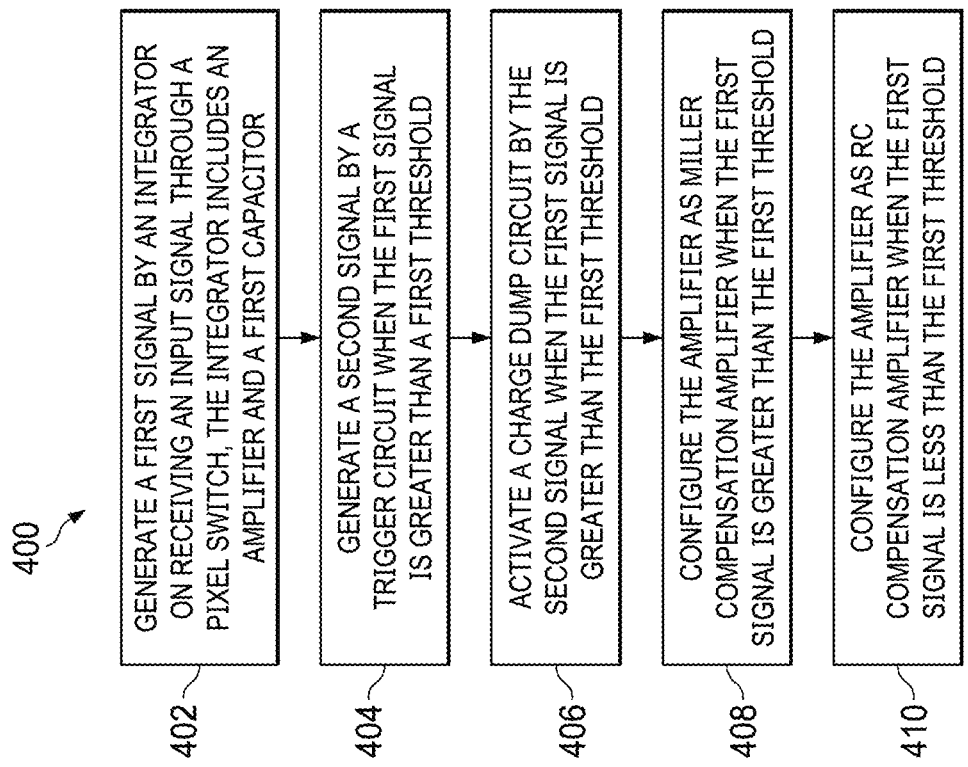
FIG. 4 is a flowchart to illustrate a method of operation of a circuit, according to an embodiment.

FIG. 4 is a flowchart 400 to illustrate a method of operation of a circuit, according to an embodiment. The flowchart 400 is explained in connection with the circuit 200 illustrated in FIG. 2. At step 402, a first signal is generated by an integrator on receiving an input signal through a pixel switch. The integrator includes an amplifier and a first capacitor. In the circuit 200, the photodiode 202 generates an input signal in response to received light pulses. The sensor 204 in the photodiode 202 receives the light pulses, and the associated capacitor Ca 206 stores the input signal generated in response to the received light pulses. The input signal from the photodiode 202 is provided to the integrator 220 which generates a first signal.

At step 404, a second signal is generated by a trigger circuit when the first signal is greater than a first threshold. The trigger circuit 270, in circuit 200, receives the first signal from the integrator 220. When the first signal generated by the integrator 220 is greater than a first threshold Vt 268, the trigger circuit 270 modifies a configuration of the charge dump circuit 280 and the integrator 220. The trigger circuit 270 generates a second signal CD 272 when the first signal is greater than the first threshold Vt 268.

A charge dump circuit is activated by the second signal when the first signal is greater than the first threshold, at step 406. When the first signal generated by the integrator 220 is greater than a first threshold Vt 268, the second signal CD 272 activates the charge dump circuit 280. The second signal CD 272 opens the fifth switch SZ5 286 and the seventh switch SZ7 290. The second signal CD 272 also closes the fourth switch S4 284 and the sixth switch S6 288 to activate the charge dump circuit 280.

At step 408, the amplifier is configured as miller compensation amplifier when the first signal is greater than the first threshold. In the integration phase, when the charge dump circuit 280 is activated by the second signal CD 272, the amplifier 230 is configured as a miller compensation amplifier. The second signal CD 272 is generated when the first signal is greater than the first threshold. The second signal CD 272 generated by the trigger circuit 270 configures the amplifier 230 as miller compensation amplifier. The second signal CD 272 opens the first switch SZ1 242 and the second switch SZ2 252. The second signal CD 272 also closes the third switch S3 248 of the amplifier 230. Thus, the second transconductor gm2 234 is degenerated and it acts as a constant current source (or current buffer) providing current to the coupling capacitor Cc 258. The combination of the first transconductor gm1 232, the second transconductor gm2 234 (being configured as the constant current source) and the third transconductor gm3 236 acts as the miller compensation amplifier 'with a very low input impedance for the input signal. A zero of the RC network (the second resistor R2 244 and the second capacitor C2 246) is bypassed when the amplifier 230 is configured as miller compensation amplifier.

At step 410, the amplifier is configured as RC compensation amplifier when the first signal is less than the first threshold. In the integration phase, when the first signal is less than the first threshold, the second signal CD 272 is not generated. During this time, the amplifier 230 is configured to RC compensation amplifier. The third S3 248 switch is opened. The first switch SZ1 242 and the second switch SZ2 252 are closed. Thus, the second transconductor gm2 234 is configured as a voltage buffer. Also, the charge dump circuit 280 in inactivated as the fourth switch S4 284 and the sixth switch S6 288 are opened while the fifth switch SZ5 286 and the seventh switch SZ7 290 are closed. The RC compensation amplifier configuration ensures low input impedance for the input signal. Other advantages of this configuration include, but not limited to, low offset drift and low error during discharge of the first capacitor C1 224 through the charge dump circuit 280.

Thus, the method illustrated by flowchart 400 provides for reconfigurable topology of the amplifier 230 between miller and RC compensation. This allows a greater number of charge dumps in a given integration time. The second transconductor gm2 234 is configured as a voltage buffer when there is no charge dump, and the amplifier 230 is configured as RC compensation amplifier to provide low input impedance to the input signal. The second transconductor gm2 234 is configured as a current buffer during the charge dump, and the amplifier 230 is configured as miller compensation amplifier to provide low input impedance to the input signal.

The method illustrated by flowchart 400 also provides for increasing the range of the amplifier 230 without increasing the area or the power of the amplifier 230. Thus, the method provides for auto-ranging which increases the dynamic range of the amplifier 230. In addition to auto-ranging, the circuit 200 provides a solution for increasing the range of the amplifier 230 to accommodate the auto-ranging disable phase. The reconfigurable topology of the amplifier 230 along with higher range of the amplifier 230 with greater number of charge dumps makes it ideal for medical imaging applications.

Figure 5:
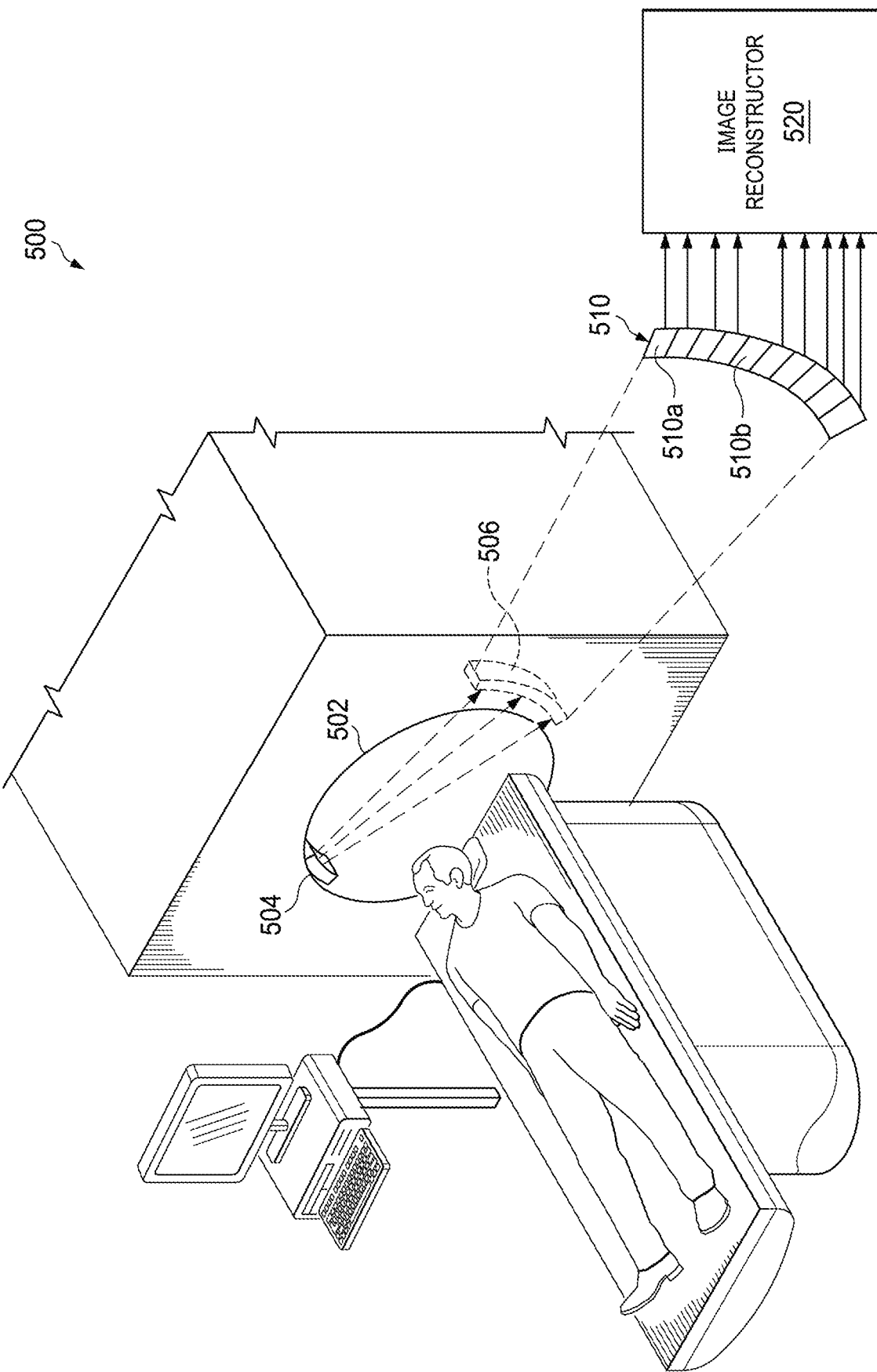
FIG. 5 illustrates an imaging system, according to an embodiment.

FIG. 5 illustrates an imaging system 500, according to an embodiment. The imaging system 500, in one version, is a CT (computed tomography) imaging system. The imaging system 500 includes a gantry 502 that receives an object, a living organism and/or a patient. The gantry 502 rotates at a defined speed. In one example, a controller provides the defined speed to the gantry 502.

An x-ray source 504 is disposed in the gantry 502. The x-ray source 504 emits x-rays towards the patient. The x-rays pass through the patient and are attenuated by the patient and received by a receiver 506. Many scans are taken progressively as the patient/object is gradually passed through the gantry 502. A cross-section of the receiver 506 is enlarged and illustrated for better clarity. The cross-section includes a plurality of detectors 510.

The plurality of detectors 510 receives the x-rays. The plurality of detectors 510 includes detectors 510a and 510b. At least one detector of the plurality of detectors 510 generates a current signal in response to the received x-rays. At least one detector is similar to the circuit 200 (illustrated in FIG. 2) in connection and operation. In one example, the detector 510b is similar to the circuit 200 in connection and operation. The photodiode in the detector 510b generates the current signal in response to the received x-rays. In one example, the photodiode in the detector 510b generates the current signal in response to the received attenuated x-rays from the patient.

The detector 510b similar to the circuit 200 includes a photodiode, a pixel switch, an integrator, a first sampling network, a second sampling network, a trigger circuit, and a charge dump circuit. The detector 510b also includes an ADC (analog to digital converter) and a processor. The detector 510b operates in a reset phase, an offset phase, an integration phase and an auto-ranging disable phase.

The photodiode generates an input signal in response to received light pulses. The input signal from the photodiode is provided to the integrator which generates a first signal. When the first signal generated by the integrator is greater than a first threshold, the trigger circuit generates a second signal which modifies a configuration of the charge dump circuit and the integrator. The charge dump circuit is activated by the second signal. The activation of charge dump circuit results in discharging of a first capacitor in the integrator through the charge dump circuit. The first capacitor dumps the charge through the charge dump circuit multiple times. Thus, the detector 510b accommodates a greater number of charge dumps in a given integration time.

The detector 510b provides reconfigurable topology of the amplifier between miller and RC compensation which allows a greater number of charge dumps in a given integration time. A second transconductor in the amplifier is configured as a voltage buffer when there is no charge dump, and the amplifier is configured as RC compensation amplifier to provide low input impedance to the input signal. The second transconductor is configured as a current buffer during the charge dump, and the amplifier is configured as miller compensation amplifier to provide low input impedance to the input signal.

The detector 510b also provides for increasing the range of the amplifier without increasing the area or the power of the amplifier. The detector 510b provides for auto-ranging which increases the dynamic range of the amplifier. In addition to auto-ranging, the detector 510b provides a solution for increasing the range of the amplifier to accommodate the auto-ranging disable phase. The reconfigurable topology of the amplifier along with higher range of the amplifier with greater number of charge dumps makes the detector 510b ideal for medical imaging applications.

The image reconstructor 520 receives the digital signal from each detector of the plurality of detectors 510 to create an image of a part of patient which is being scanned by the imaging system 500. In one example, the ADC and the processor in the detector 510b are part of the image reconstructor 520. The image reconstructor 520, in one example, includes a processor. The processor can be, for example, a CISC-type (Complex Instruction Set Computer) CPU, RISC-type CPU (Reduced Instruction Set Computer), or a digital signal processor (DSP). The image reconstructor 520, in one example, is disposed outside the imaging system 500. The imaging system 500 may include one or more conventional components that are not discussed here for simplicity of the description.

Modifications are possible in the described embodiments, and other embodiments are possible, within the scope of the claims.

What is claimed is:

1. A circuit comprising:
   an integrator configured to generate a first signal responsive to an input signal, the integrator having an amplifier and a first capacitor, the first capacitor coupled between an input terminal of the amplifier and an output terminal of the amplifier;
   a trigger circuit coupled to the integrator and configured to receive the first signal; and
   a charge dump circuit coupled to the integrator and the trigger circuit, the trigger circuit configured to modify configuration of the charge dump circuit and the amplifier when the first signal is greater than a first threshold.

2. The circuit of claim 1, wherein the integrator further comprises
   a reset switch coupled in parallel to the first capacitor, and the amplifier is coupled to the charge dump circuit and configured to receive the input signal.

3. The circuit of claim 2, wherein the amplifier further comprises:
   a first transconductor whose positive terminal is configured to receive the input signal and whose negative terminal is coupled to a first voltage source;
   a first switch coupled to an output terminal of the first transconductor;
   a second transconductor whose positive terminal is coupled to the first switch;
   an RC network coupled to the first switch and to the second transconductor; and
   a third transconductor whose negative terminal is coupled to the second transconductor and whose output terminal is coupled to the first capacitor.

4. The circuit of claim 3, wherein the amplifier further comprises:
   a second switch coupled between a negative terminal and an output terminal of the second transconductor;
   a third capacitor coupled between the negative terminal of the second transconductor and a ground terminal;
   a first resistor coupled between the second and the third transconductor;
   a third switch coupled between the output terminal of first transconductor and the negative terminal of the third transconductor; and
   a coupling capacitor coupled between the negative terminal and the output terminal of the third transconductor.

5. The circuit of claim 4, wherein the trigger circuit further comprises a comparator configured to compare the first signal and the first threshold, and configured to generate a second signal when the first signal is greater than the first threshold, the second signal configured to modify configuration of the charge dump circuit and the integrator.

6. The circuit of claim 5, wherein the charge dump circuit comprises:
   a fourth switch coupled to the integrator; and
   a fourth capacitor coupled to the fourth switch and to one of a second voltage source and a third voltage source.

7. The circuit of claim 6, wherein the charge dump circuit further comprises:
   a fifth switch coupled between the fourth capacitor and the second voltage source;
   a sixth switch coupled between the fourth capacitor and the third voltage source; and a seventh switch coupled between a fourth voltage source and the fourth switch, the fourth capacitor is coupled to the seventh switch.

8. The circuit of claim 7 further comprising a first sampling network and a second sampling network coupled to the integrator, the first sampling network include a primary switch, and the second sampling network includes a secondary switch.

9. The circuit of claim 8, further comprising a photodiode coupled to the integrator through a pixel switch, the photodiode configured to generate the input signal in response to received light pulses, the photodiode comprising:
a sensor configured to receive the light pulses; and
an associated capacitor configured to store the input signal generated in response to the received light pulses.

10. The circuit of claim 9, further configured to operate in a reset phase, an offset phase, an integration phase and an auto-ranging disable phase, wherein in the reset phase:
the pixel switch is opened;
the reset switch, the first switch and the second switch are closed;
the third switch, the fourth switch and the sixth switch are opened;
the fifth switch and the seventh switch are closed; and
the primary switch and the secondary switch are opened.

11. The circuit of claim 10, wherein in the offset phase:
the reset switch is opened; and
the primary switch is closed and an offset voltage is sampled on the first sampling network.

12. The circuit of claim 10, wherein in the integration phase:
the reset switch remains open;
the primary switch is opened;
the pixel switch is closed;
the first switch, the second switch, the fifth switch and the seventh switch remain closed;
the third switch, the fourth switch and the sixth switch remain open; and
the input signal from the photodiode is provided to the integrator, and the integrator generates the first signal responsive to the input signal.

13. The circuit of claim 10, wherein in the integration phase when the first signal is greater than the first threshold, the trigger circuit generates the second signal which:
opens the first switch and the second switch in the amplifier;
closes the third switch in the amplifier;
opens the fifth switch and the seventh switch; and
closes the fourth switch and the sixth switch to activate the charge dump circuit.

14. The circuit of claim 10, wherein the auto-ranging disable phase is initiated during the integration phase, and the auto-ranging disable phase ends with the integration phase.

15. The circuit of claim 10, wherein in the auto-ranging disable phase:
the pixel switch remains closed;
the fourth switch and the sixth switch are opened;
the fifth switch and the seventh switch are closed;
the third switch is opened;
the first switch and the second switch are closed; and
the secondary switch is closed, and a signal voltage is sampled on the second sampling network.

16. A method comprising:
generating a first signal by an integrator on receiving an input signal through a pixel switch, the integrator includes an amplifier and a first capacitor;
generating a second signal by a trigger circuit when the first signal is greater than a first threshold;
activating a charge dump circuit by the second signal when the first signal is greater than the first threshold;
configuring the amplifier as miller compensation amplifier when the first signal is greater than the first threshold, the amplifier configured to receive the second signal; and
configuring the amplifier as RC compensation amplifier when the first signal is less than the first threshold.

17. The method of claim 16, further comprising generating the input signal by a photodiode in response to received light pulses and the photodiode is coupled to the pixel switch.

18. The method of claim 16, wherein activating the charge dump circuit further comprises:
coupling a terminal of a fourth capacitor in the charge dump circuit to the first capacitor; and
coupling a terminal of fourth capacitor to a third voltage source.

19. The method of claim 16, wherein configuring the amplifier as miller compensation amplifier further comprises:
providing the input signal to a first transconductor;
coupling an output of the first transconductor to an input of a third transconductor; and
configuring a second transconductor as a current source to provide current to a coupling capacitor coupled in parallel to the third transconductor.

20. The method of claim 19, wherein configuring the amplifier as RC compensation amplifier further comprises:
providing the input signal to the first transconductor;
coupling an output of the first transconductor to an RC network and to an input of the second transconductor; and
coupling an output of the second transconductor to an input of the third transconductor.

21. An imaging system comprising:
an x-ray source configured to generate x-rays; and
a receiver configured to receive x-rays, the receiver comprising a plurality of detectors, and at least one detector of the plurality of detectors comprising:
an integrator configured to generate a first signal responsive to an input signal, the integrator having an amplifier and a first capacitor, the first capacitor coupled between an input terminal of the amplifier and an output terminal of the amplifier;
a trigger circuit coupled to the integrator and configured to receive the first signal; and
a charge dump circuit coupled to the integrator and the trigger circuit, the trigger circuit configured to modify configuration of the charge dump circuit and the amplifier when the first signal is greater than a first threshold.

* * * * *